United States Patent
Stein et al.

(10) Patent No.: US 11,616,862 B2
(45) Date of Patent: Mar. 28, 2023

(54) SYSTEM AND METHOD FOR COMPRESSING CONTROLLER AREA NETWORK (CAN) MESSAGES

(71) Applicant: SAFERIDE TECHNOLOGIES LTD., Tel Aviv-Jaffa (IL)

(72) Inventors: Yehiel Stein, Ramat Hasharon (IL); Yossi Vardi, Tel Aviv (IL); Maxim Komm, Tel Aviv (IL)

(73) Assignee: Saferide Technologies Ltd., Tel Aviv (IL)

(*) Notice: Subject to any disclaimer, the term of this patent is extended or adjusted under 35 U.S.C. 154(b) by 102 days.

(21) Appl. No.: 17/436,616

(22) PCT Filed: Feb. 27, 2020

(86) PCT No.: PCT/IL2020/050227
§ 371 (c)(1),
(2) Date: Sep. 6, 2021

(87) PCT Pub. No.: WO2020/183448
PCT Pub. Date: Sep. 17, 2020

(65) Prior Publication Data
US 2022/0159098 A1    May 19, 2022

Related U.S. Application Data

(60) Provisional application No. 62/816,248, filed on Mar. 11, 2019.

(51) Int. Cl.
*H04L 69/04* (2022.01)
*H04L 12/40* (2006.01)

(52) U.S. Cl.
CPC .............. *H04L 69/04* (2013.01); *H04L 12/40* (2013.01); *H04L 2012/40215* (2013.01); *H04L 2012/40273* (2013.01)

(58) Field of Classification Search
CPC ..................... H04L 69/04; H04L 12/40; H04L 2012/40215; H04L 2012/40273;
(Continued)

(56) References Cited

U.S. PATENT DOCUMENTS 6,985,932 B1   1/2006 Glaser et al.
10,129,124 B2 * 11/2018 Joo ......................... H04L 67/12
(Continued)

FOREIGN PATENT DOCUMENTS

EP        2945290 A2    11/2015
WO    WO2019043446 A1    3/2019

OTHER PUBLICATIONS

Wu Yujing et al: "Design and implementation of CAN data compression algorithm", 2014 IEEE International Symposium on Circuits and Systems (ISCAS), IEEE, Jun. 1, 2014 (Jun. 1, 2014), pp. 582-585, XP032624518, DOI: 10.1109/ISCAS.2014.6865202. retrieved on Jul. 24, 2014] abstract *paragraph [II.A]-paragraph [II.B].
(Continued)

*Primary Examiner* — Jay P Patel

(57) ABSTRACT

A system for compressing Controller Area Network (CAN) messages, the system comprising a processing resource configured to: obtain a CAN messages sequence including a plurality of CAN messages intercepted at a given order by at least one device adapted to monitor messages transmitted via communication channel(s) of a vehicle; group the CAN messages of the CAN messages sequence into MID groups, by a CAN MID field of the CAN messages; for each given MID group of the MID groups split the CAN messages of the MID group into field groups, wherein each field group comprises a respective field of a plurality of fields of the CAN messages of the MID group; employ at least one compression scheme on at least one of the field groups; generate a data structure comprising the field groups; and
(Continued)

compress the data structure using a lossless compression algorithm, giving rise to a compressed data structure.

20 Claims, 3 Drawing Sheets

(58) Field of Classification Search
CPC .. H03M 7/3066; H03M 7/3077; H03M 7/707; G06F 2209/542; G06F 9/546
See application file for complete search history.

(56) References Cited

U.S. PATENT DOCUMENTS

| | | | |
|---|---|---|---|
| 10,484,425 B2 * | 11/2019 | Giannopoulos | H04L 63/1483 |
| 10,599,840 B2 * | 3/2020 | Dagan | H04L 63/1466 |
| 10,601,607 B2 * | 3/2020 | Maeda | H04L 69/08 |
| 10,650,682 B2 * | 5/2020 | Grewe | G08G 1/164 |
| 10,701,102 B2 * | 6/2020 | Zeng | H04L 63/062 |
| 10,834,207 B2 * | 11/2020 | Acharya | H04L 12/40 |
| 11,012,255 B2 * | 5/2021 | Maeda | H04L 12/2836 |
| 11,310,070 B2 * | 4/2022 | Maeda | H04L 12/46 |
| 11,323,548 B2 * | 5/2022 | Entelis | H04L 12/40 |
| 11,356,475 B2 * | 6/2022 | Ujiie | H04L 63/12 |
| 11,463,275 B2 * | 10/2022 | Maeda | H04L 12/2836 |
| 11,546,448 B2 * | 1/2023 | Entelis | H04L 69/04 |
| 2009/0300039 A1 | 12/2009 | Stengelin | |
| 2015/0089236 A1 | 3/2015 | Han et al. | |
| 2017/0022825 A1 | 1/2017 | Caruso et al. | |
| 2017/0236419 A1 * | 8/2017 | Grewe | G01S 17/931 340/870.07 |
| 2018/0241852 A1 | 8/2018 | Maluf | |
| 2019/0098047 A1 * | 3/2019 | Giannopoulos | H04L 63/1483 |
| 2019/0104149 A1 * | 4/2019 | Zeng | H04L 63/0876 |
| 2019/0265965 A1 * | 8/2019 | Acharya | H04L 9/3263 |
| 2022/0046114 A1 * | 2/2022 | Entelis | H04L 69/08 |
| 2022/0224777 A1 * | 7/2022 | Entelis | H04L 69/08 |

OTHER PUBLICATIONS

Anonymous: "CAN bus", Wikipedia, Feb. 20, 2019 (Feb. 20, 2019), pp. 1-17, XP055902178, Retrieved from the Internet: URL:https://en.wikipedia.org/w/index.php?t itle=CAN_bus&oldid=884235592 [retrieved on Mar. 16, 2022] * the whole document *.

Kim Yeon-Jin et al: "4-Bit Data Arrangement Algorithm for CAN Compression", 2018 International SOC Design Conference (ISOCC), IEEE, Nov. 12, 2018 (Nov. 12, 2018), pp. 216-217, XP033523016,DOI: 10.1109/ISOCC.2018.8649946 [retrieved on Feb. 22, 2019 p. 217.

Xing. "The Compression of roiOperational Data Time Series in Vehicle Embedded Systems," 1-39 Degree Project in Computer Science and Computer Engineering, Sweden, 2018, [retrieved Jun. 16, 2020on). Retrieved from the Internet: <URL: http://www.diva-portal.org/smash/geVdiva2:1263588/FULL TEXT01.pdf> pp. 1-95.

Schmidgall. "Automotive embedded systems software Reprogramming," School of Engineering 1-39 and Design Brunel University, May 2012 [retrieved Jun. 16, 2020on]. Retrieved from the Internet: <URL:https://bura.brunel.ac.uk/bitstream/2438/7070/1 /FulltextThesis.pdf> pp. 1-99.

Gazdag et al. "Efficient Lossless Compression of CAN Traffic Logs," 2017 25th International Conference noSoftware, Telecommunications and Computer Networks (SoftCOM) D01: 10.23919/SOFTCOM.2017 .8115527, [retrieved Jun. 17, 2020on]. Retrieved from the Internet <URL: https://ieeexplore.ieee.or1=1/documenV0115527> pp. 1-6.

* cited by examiner

SYSTEM AND METHOD FOR COMPRESSING CONTROLLER AREA NETWORK (CAN) MESSAGES

TECHNICAL FIELD

The invention relates to a system and method for compressing CAN messages.

BACKGROUND

The operation of vehicles such as, for example, cars, trucks, motorcycles, buses, trains, airplanes, drones, naval vessels, and/or the like has long ago become heavily reliant on automated systems utilizing multiple Electronic Control Units (ECU) deployed in the vehicle to control almost every aspect of the operation of the vehicle. This trend is naturally further intensified with the evolution of autonomic vehicles where the human factor, i.e. the human driver, is no longer the prime controller of the vehicle which is rather controlled by the automated and autonomous systems.

These automated and optionally autonomous systems may include a plurality of devices, for example, ECUs, sensors, Input/output WO) controllers and/or the like communicating with each other to transfer status and/or control data essential for operating the vehicle. These systems may further exchange data with each other thus creating a comprehensive, complex ecosystem within the vehicle.

To support this data exchange, each vehicle may include multiple wired and/or wireless communication channels, for example, Controller Area Network (CAN) bus, Local Interconnect Network (LIN), FlexRay, Local area Network (LAN), Ethernet, automotive Ethernet, Wireless LAN (WLAN, e.g. Wi-Fi), Media Oriented Systems Transport (MOST), Wireless CAN (WCAN) and/or the like to support the data transfer between the deployed devices. The vehicle communication channels are often segmented due to one or more constraints and/or purposes, for example, a requirement for functional segregation, vehicle physical deployment constraints, a hierarchical communication structure and/or the like.

A Controller Area Network (CAN) bus standard, for example, is a vehicle bus standard used by vehicle manufacturers. The CAN bus standard defines, inter alia, a structure of messages (referred to herein as CAN messages) to be transmitted on a vehicle's CAN bus. Each manufacturer, optionally in cooperation with Original Equipment Manufacturers (OEMs) providing parts for the vehicle, can design a custom CAN bus messaging scheme that is based on the CAN bus standard, so that messages (also referred to as CAN messages) can be exchanges between the various system of the vehicles manufactured thereby.

As noted, the automotive industry evolves and more and more vehicles become connected cars equipped with an Internet connection and/or with a wireless local area network, etc. This provides many clear benefits for both the car manufacturers, and the car owners and users. However, due to the fact that the amount of CAN messages transmitted over a vehicle's CAN bus is enormous, sharing the CAN messages with external entities, external to the vehicle on which they are transmitted, requires a large bandwidth. Similarly, storing such CAN messages on a storage device also requires large storage space.

There is thus a need in the art fir a new method and system for compressing CAN messages.

GENERAL DESCRIPTION

In accordance with a first aspect of the presently disclosed subject matter, there is provided a system for compressing Controller Area Network (CAN) messages, the system comprising a processing resource configured to: obtain a CAN messages sequence including a plurality of CAN messages intercepted at a given order by at least one device adapted to monitor messages transmitted via at least one segment of at least one communication channel of a vehicle, each given CAN message of the CAN messages sequence comprising groups of bits forming at least the following fields: (a) a CAN Message Identifier (MID) field comprised of one or more of the bits representing the CAN MID of the given CAN message, (b) a Data Length Code (DLC) field comprised of one or more of the bits representing a payload length of a payload of the given CAN message, (c) a payload field comprised of one or more of the bits representing the payload of the given CAN message, and (d) a timestamp field comprised of one or more of the bits representing a timestamp of a time of interception of the given CAN message by the at least one device; group the CAN messages of the CAN messages sequence into MID groups, by the CAN MID field; for each given MID group of the MID groups split the CAN messages of the MID group into field groups, wherein each field group comprises a respective field of the fields of the CAN messages of the MID group; employ at least one compression scheme on at least one of the field groups; generate a data structure comprising the field groups; wherein: (a) the field groups that are associated with identical fields are grouped together into field type groups, (b) each of the field type groups is ordered by the CAN MID field associated with the MID group associated with the field groups of the respective field type group, (c) the fields within each of the filed groups are ordered according to an order of interception of the respective CAN messages, and (d) the field type groups are stored at respective known locations within the data structure; wherein the data structure enables reordering the CAN messages according to the given order; and compress the data structure using a lossless compression algorithm, giving rise to a compressed data structure.

In some cases, the compression scheme is employed on field groups associated with the payload field, being payload field groups, and wherein the compression scheme further includes, for each payload field group of the payload field groups: generating a bitmask indicative of (a) constant bits of bits of the payloads within the payload field group, being bits that do not change between the payloads within the payload field group, and (b) non-constant bits of the payloads within the payload field group, being bits that change between the payloads within the payload field group; omitting from the payloads within the payload field group except a first payload within the payload field group, the bits of the payloads within the payload field group that are indicated as constant bits by the bitmask; and adding the bitmask to the data structure, thereby enabling reconstructing the payloads upon decompressing the compressed data structure.

In some cases, the compression scheme is employed on field groups associated with the payload field, being payload field groups, and wherein the compression scheme further includes, for each payload field group of the payload field groups: generating a bitmask indicative of (a) constant bits of bits of the payloads within the payload field group, being bits that do not change between the payloads within the payload field group, and (b) non-constant bits of the payloads within the payload field group, being bits that change between the payloads within the payload field group; omitting from the payloads within the payload field group the bits of the payloads within the payload field groups that are indicated as constant bits by the bitmask; and adding to the data structure (i) the bitmask, and (ii) a value of each of the constant bits, thereby enabling reconstructing the payloads upon decompressing the compressed data structure.

In some cases, the processing resource is further configured to perform the following: identify, within the CAN messages sequence, groups of time conflicting messages, if any, wherein each group comprises CAN messages of the CAN messages sequence having identical timestamps; and associate, within the data structure, each of the time conflicting messages, with a respective index indicative of an order of interception of the time conflicting messages on the communication channel, thereby enabling reordering the CAN messages according to the CAN messages interception time upon decompressing the compressed data structure while resolving conflicts between the CAN messages having the identical timestamps.

In some cases, the compression scheme is employed on the field groups associated with the CAN MID field, being MID field groups, and Wherein the compression scheme includes: counting a number of elements in each MID field group of the MID field groups, giving rise to respective CAN MID counters; and replacing the elements in each MID field group of the MID field groups with a selected element of the elements and the respective CAN MID counter indicative of a number of elements identical to the selected element, thereby enabling reconstructing the MID field group upon decompressing the compressed data structure.

In some cases, the compression scheme is further employed on field groups associated with the DLC field, being DLC field groups, and wherein the compression scheme further includes: identifying, within the MID groups, constant length groups being the MID groups comprised of CAN messages that all have an identical value in the DLC field; for each constant length group, adding to the corresponding MID field group an indication of the identical value and delete all elements of the respective DLC field groups, thereby enabling reconstructing the DLC field group upon decompressing the compressed data structure.

In some cases, the compression scheme further includes: identifying, within the MID groups, non-constant length groups being the MID groups comprised of CAN messages that do not have an identical value in the DLC field; for each non-constant length group: identifying a most frequent value in the DLC field of the CAN messages within the non-constant length group; adding to the corresponding MID field group an indication of the most frequent value; and replacing all elements of the respective DLC, field groups whose values are equal to the most frequent value with a default value indication, thereby enabling reconstructing the DLC field group upon decompressing the compressed data structure.

In some cases, the compression scheme further includes: identifying, within the MID groups, non-constant length groups being the MID groups comprised of CAN messages that do not have an identical value in the DLC field; for each non-constant length group: identifying a most frequent value in the DLC field of the CAN messages within the non-constant length group; adding to the corresponding MID field group an indication of the most frequent value; omitting all elements of the respective DLC field groups whose values are equal to the most frequent value; and adding a list of exceptions indicative of the elements of the respective DLC field groups whose values are not equal to the most frequent value, thereby enabling reconstructing the DLC field group upon decompressing the compressed data structure.

In some cases, the compression scheme is employed on the field groups associated with the timestamp field, and wherein the processing resource is further configured to truncate one or more least significant bits of the timestamps of each timestamp in the field groups associated with the timestamp field.

In some cases, the processing resource is further configured to perform the following: identify, within the field groups associated with the timestamp field, time conflicting timestamps groups, if any, wherein each time conflicting timestamps group comprises identical timestamps; and associate, within the data structure, each of the timestamps within each respective time conflicting timestamps group of the time conflicting timestamps groups, with a respective index indicative of an order of the time conflicting timestamps within the respective time conflicting timestamps group, thereby enabling reordering the CAN messages according to the CAN messages interception time upon decompressing the compressed data structure while resolving conflicts between timestamps.

In some cases, the processing resource is further configured to perform the following: generate, for each CAN message of the CAN messages sequence, an exception indication indicating if a number of bits required to represent a time difference between interception of the respective CAN message and a preceding CAN message preceding the respective CAN message in the CAN messages sequence, if any, is larger than a bit number threshold; and for each CAN message of the CAN messages sequence, having the exception indication indicating that the number of bits required to represent the time difference between interception of the respective CAN message and the preceding CAN message preceding the respective CAN message in the CAN messages sequence is smaller than or equal to the bit number threshold, replace the timestamp of the respective CAN message with bits representing the time difference between interception of the respective CAN message and the preceding CAN message preceding the respective CAN message in the CAN messages sequence, thereby enabling reconstructing the respective timestamp upon decompressing the compressed data structure.

In some cases, the compression scheme is further employed on field groups associated with the timestamp field, being timestamp field groups, and wherein the compression scheme further includes, for each given MID group of the MID groups: determining an average interarrival time of the CAN messages within the given MID group; replacing the timestamp of each CAN message in the given MID group with a difference between the CAN message's timestamp and the CAN message's expected timestamp determined based on the average interarrival time; and adding an indication of the average interarrival time of the CAN messages within the given MID group to the data structure.

In some cases, the compression scheme is employed on field groups associated with the payload field, being payload field groups, and wherein the compression scheme further includes: generating a bitmask indicative of (a) cyclic bits of bits of the payloads within the payload field groups, being bits that have respective repeating patterns over the payloads within the payload field groups, and (b) non-cyclic bits of the payloads within the payload field groups, being bits that do not have a repeating pattern over the payloads within the payload field groups; omitting from the payloads within the payload field group the bits of the payloads within the payload field groups that are indicated as cyclic bits by the bitmask; adding the bitmask and the repeating patterns to the data structure, thereby enabling reconstructing the payloads upon decompressing the compressed data structure.

In some cases, the compression scheme further includes padding payloads, after omitting the cyclic bits, with one or more padding bits to supplement each of the payloads to be of a number of bits that is a multiplication of eight.

In some cases, the compression scheme is employed on field groups associated with the payload field, being payload field groups, and wherein the compression scheme further includes: updating the payloads within each given payload field group of the payload field groups by performing an XOR operation or a subtract operation, between each payload of the given payload field group and its preceding payload, if any.

In some cases, the processing resource is further configured to employ deduplication on the payloads within the payload field groups, using a hash function.

In some cases, the compression scheme is employed on field groups associated with the payload field, being payload field groups, and wherein the compression scheme further includes: updating the payloads within each given payload field group of the payload field groups by performing an XOR operation or a subtract operation, between the bits of the payloads positioned at each position and the bits of the payloads positioned at a preceding position preceding the respective position, if any.

In some cases, the processing resource is further configured to employ deduplication on the payloads within the payload field groups, using a hash function.

In some cases, lossless compression algorithm is one of the following: Lempel-Ziv (LZ), Lempel-Ziv-Welch (LZW), Deflate, Lempel-Ziv-Oberhumer (LZO), Lempel-Ziv-Markov chain Algorithm (LIMA), Lempel-Ziv-Storer-Szymanski (LZSS), Broth, or Zstandard.

In accordance with a second aspect of the presently disclosed subject matter, there is provided a method for compressing Controller Area Network (CAN) messages, the method comprising: obtaining, by a processing resource, a CAN messages sequence including a plurality of CAN messages intercepted at a given order by at least one device adapted to monitor messages transmitted via at least one segment of at least one communication channel of a vehicle, each given CAN message of the CAN messages sequence comprising groups of bits forming at least the following fields: (a) a CAN Message identifier (MID) field comprised of one or more of the bits representing the CAN MID of the given CAN message, (b) a Data Length Code (DLC) field comprised of one or more of the bits representing a payload length of a payload of the given CAN message, (c) a payload field comprised of one or more of the bits representing the payload of the given CAN message, and (d) a timestamp field comprised of one or more of the bits representing a timestamp of a time of interception of the given CAN message by the at least one device; grouping, by the processing resource, the CAN messages of the CAN messages sequence into MID groups, by the CAN MID field; for each given MID group of the MID groups, splitting, by the processing resource, the CAN messages of the MID group into field groups, wherein each field group comprises a respective field of the fields of the CAN messages of the MID group; employing, by the processing resource, at least one compression scheme on at least one of the field groups; generating, by the processing resource, a data structure comprising the field groups, wherein: (a) the field groups that are associated with identical fields are grouped together into field type groups, (h) each of the field type groups is ordered by the CAN MID field associated with the MID group associated with the field groups of the respective field type group, (c) the fields within each of the filed groups are ordered according to an order of interception of the respective CAN messages, and (d) the field type groups are stored at respective known locations within the data structure; wherein the data structure enables reordering the CAN messages according to the given order; and compressing, by the processing resource, the data structure using a lossless compression algorithm, giving rise to a compressed data structure.

In some cases, the compression scheme is employed on field groups associated with the payload field, being payload field groups; and wherein the compression scheme further includes, for each payload field group of the payload field groups: generating a bitmask indicative of (a) constant bits of bits of the payloads within the payload field group, being bits that do not change between the payloads within the payload field group, and (b) non-constant bits of the payloads within the payload field group, being bits that change between the payloads within the payload field group; omitting from the payloads within the payload field group except a first payload within the payload field group, the bits of the payloads within the payload field group that are indicated as constant bits by the bitmask; and adding the bitmask to the data structure, thereby enabling reconstructing the payloads upon decompressing the compressed data structure.

In some cases, the compression scheme is employed on field groups associated with the payload field, being payload field groups, and wherein the compression scheme further includes, for each payload field group of the payload field groups: generating a bitmask indicative of (a) constant bits of bits of the payloads within the payload field group, being bits that do not change between the payloads within the payload field group, and (b) non-constant bits of the payloads within the payload field group, being bits that change between the payloads within the payload field group; omitting from the payloads within the payload field group the bits of the payloads within the payload field groups that are indicated as constant bits by the bitmask; and adding to the data structure (i) the bitmask, and (ii) a value of each of the constant bits, thereby enabling reconstructing the payloads upon decompressing the compressed data structure.

In some cases, the method further comprises: identifying, by the processing resource, within the CAN messages sequence, groups of time conflicting messages, if any, wherein each group comprises CAN messages of the CAN messages sequence having identical timestamps; and associating, by the processing resource, within the data structure, each of the time conflicting messages, with a respective index indicative of an order of interception of the time conflicting messages on the communication channel, thereby enabling reordering the CAN messages according to the CAN messages interception time upon decompressing the compressed data structure while resolving conflicts between the CAN messages having the identical timestamps.

In some cases, the compression scheme is employed on the field groups associated with the CAN MID field, being MID field groups, and wherein the compression scheme includes: counting a number of elements in each MID field group of the MID field groups, giving rise to respective CAN MID counters; and replacing the elements in each MID field group of the MID field groups with a selected element of the elements and the respective CAN MID counter indicative of a number of elements identical to the selected element, thereby enabling reconstructing the MID field group upon decompressing the compressed data structure.

In some cases, the compression scheme is further employed on field groups associated with the DLC field, being DLC field groups, and wherein the compression scheme further includes: identifying, within the MID groups, constant length groups being the MID groups comprised of CAN messages that all have an identical value in the DLC field; for each constant length group, adding to the corresponding MID field group an indication of the identical value and delete all elements of the respective DLC field groups, thereby enabling reconstructing the DLC field group upon decompressing the compressed data structure.

In some cases, the compression scheme further includes: identifying, within the MID groups, non-constant length groups being the MID groups comprised of CAN messages that do not have an identical value in the DLC field; for each non-constant length group: identifying a most frequent value in the DLC field of the CAN messages within the non-constant length group; adding to the corresponding MID field group an indication of the most frequent value; and replacing all elements of the respective DLC field groups whose values are equal to the most frequent value with a default value indication, thereby enabling reconstructing the DLC field group upon decompressing the compressed data structure.

In some cases, the compression scheme further includes: identifying, within the MID groups, non-constant length groups being the MID groups comprised of CAN messages that do not have an identical value in the DLC field; for each non-constant length group: identifying a most frequent value in the DLC field of the CAN messages within the non-constant length group; adding to the corresponding MID field group an indication of the most frequent value; omitting all elements of the respective DLC field groups whose values are equal to the most frequent value; and adding a list of exceptions indicative of the elements of the respective DLC field groups whose values are not equal to the most frequent value, thereby enabling reconstructing the DLC field group upon decompressing the compressed data structure.

In some cases, the compression scheme is employed on the field groups associated with the timestamp field, and wherein the method further comprises truncating, by the processing resource, one or more least significant bits of the timestamps of each timestamp in the field groups associated with the timestamp field.

In some cases, the method further comprises: identifying, by the processing resource, within the field groups associated with the timestamp field, time conflicting timestamps groups, if any, wherein each time conflicting timestamps group comprises identical timestamps; and associating, by the processing resource, within the data structure, each of the timestamps within each respective time conflicting timestamps group of the time conflicting timestamps groups, with a respective index indicative of an order of the time conflicting timestamps within the respective time conflicting timestamps group, thereby enabling reordering the CAN messages according to the CAN messages interception time upon decompressing the compressed data structure while resolving conflicts between timestamps.

In some cases, the method further comprising: generating, by the processing resource, for each CAN message of the CAN messages sequence, an exception indication indicating if a number of bits required to represent a time difference between interception of the respective CAN message and a preceding CAN message preceding the respective CAN message in the CAN messages sequence, if any, is larger than a bit number threshold; and for each CAN message of the CAN messages sequence, having the exception indication indicating that the number of bits required to represent the time difference between interception of the respective CAN message and the preceding CAN message preceding the respective CAN message in the CAN messages sequence is smaller than or equal to the bit number threshold, replacing, by the processing resource, the timestamp of the respective CAN message with bits representing the time difference between interception of the respective CAN message and the preceding CAN message preceding the respective CAN message in the CAN messages sequence, thereby enabling reconstructing the respective timestamp upon decompressing the compressed data structure.

In some cases, the compression scheme is further employed on field groups associated with the timestamp field, being timestamp field groups, and wherein the compression scheme further includes, for each given MID group of the MID groups: determining an average interarrival time of the CAN messages within the given MID group; replacing the timestamp of each CAN message in the given MID group with a difference between the CAN message's timestamp and the CAN message's expected timestamp determined based on the average interarrival time; and adding an indication of the average interarrival time of the CAN messages within the given MID group to the data structure.

In some cases, the compression scheme is employed on field groups associated with the payload field, being payload field groups, and wherein the compression scheme further includes: generating a bitmask indicative of (a) cyclic bits of bits of the payloads within the payload field groups, being bits that have respective repeating patterns over the payloads within the payload field groups, and (b) non-cyclic bits of the payloads within the payload field groups, being bits that do not have a repeating pattern over the payloads within the payload field groups; omitting from the payloads within the payload field group the bits of the payloads within the payload field groups that are indicated as cyclic bits by the bitmask; adding the bitmask and the repeating patterns to the data structure, thereby enabling reconstructing the payloads upon decompressing the compressed data structure.

In some cases, the compression scheme further includes padding payloads, after omitting the cyclic bits, with one or more padding bits to supplement each of the payloads to be of a number of bits that is a multiplication of eight.

In some cases, the compression scheme is employed on field groups associated with the payload field, being payload field groups, and wherein the compression scheme further includes: updating the payloads within each given payload field group of the payload field groups by performing an XOR operation or a subtract operation, between each payload of the given payload field group and its preceding payload, if any.

In some cases, the method further comprises employing, by the processing resource, deduplication on the payloads within the payload field groups, using a hash function.

In some cases, the compression scheme is employed on field groups associated with the payload field, being payload field groups, and wherein the compression scheme further includes: updating the payloads within each given payload field group of the payload field groups by performing an XOR operation or a subtract operation, between the bits of the payloads positioned at each position and the bits of the payloads positioned at a preceding position preceding the respective position, if any.

In some cases, the method further comprises employing, by the processing resource, deduplication on the payloads within the payload field groups, using a hash function.

In some cases, lossless compression algorithm is one of the following: Lempel-Ziv (LZ), Tempel-Ziv-Welch (LZW), Deflate, Lempel-Ziv-Oberhumer (LZO), Lempel-Ziv-Markov chain Algorithm (LZMA), Lempel-Ziv-Storer-Szymanski (LZSS), Brotli, or Zstandard.

In accordance with a third aspect of the presently disclosed subject matter, there is provided a non-transitory computer readable storage medium having computer readable program code embodied therewith, the computer readable program code, executable by a processing resource to perform a method for compressing Controller Area Network (CAN) messages, the method comprising: obtaining, by a processing resource, a CAN messages sequence including a plurality of CAN messages intercepted at a given order by at least one device adapted to monitor messages transmitted via at least one segment of at least one communication channel of a vehicle, each given CAN message of the CAN messages sequence comprising groups of bits forming at least the following fields: (a) a CAN Message Identifier (MID) field comprised of one or more of the bits representing the CAN MID of the given CAN message, (b) a Data Length Code (DLC) field comprised of one or more of the bits representing a payload length of a payload of the given CAN message, (c) a payload field comprised of one or more of the bits representing the payload of the given CAN message, and (d) a timestamp field comprised of one or more of the bits representing a timestamp of a time of interception of the given CAN message by the at least one device; grouping, by the processing resource, the CAN messages of the CAN messages sequence into MID groups, by the CAN MID field; for each given MID group of the MID groups, splitting, by the processing resource, the CAN messages of the MID group into field groups, wherein each field group comprises a respective field of the fields of the CAN messages of the MID group; employing, by the processing resource, at least one compression scheme on at least one of the field groups; generating, by the processing resource, a data structure comprising the field groups, wherein: (a) the field groups that are associated with identical fields are grouped together into field type groups, (b) each of the field type groups is ordered by the CAN MID field associated with the MID group associated with the field groups of the respective field type group, (c) the fields within each of the filed groups are ordered according to an order of interception of the respective CAN messages, and (d) the field type groups are stored at respective known locations within the data structure; wherein the data structure enables reordering the CAN messages according to the given order; and compressing, by the processing resource, the data structure using a lossless compression algorithm, giving rise to a compressed data structure.

BRIEF DESCRIPTION OF THE DRAWINGS

In order to understand the presently disclosed subject matter and to see how it may be carried out in practice, the subject matter will now be described, by way of non-limiting examples only, with reference to the accompanying drawings, in which.

DETAILED DESCRIPTION

Figure 1:
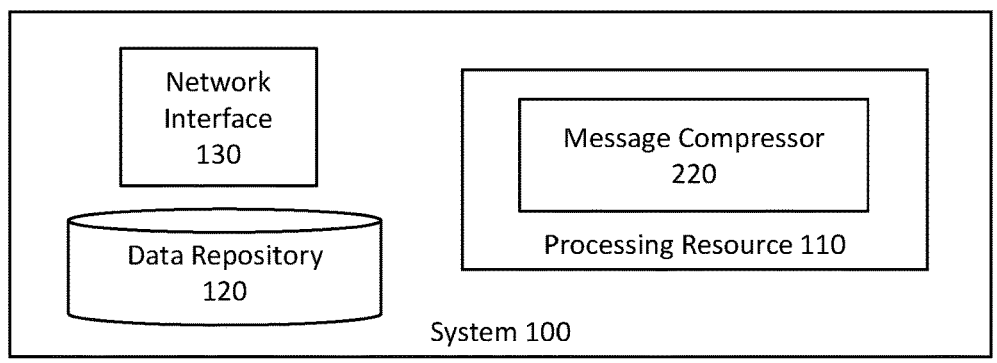
FIG. 1 is a block diagram schematically illustrating one example of a system for compressing Controller Area Network (CAN) messages, in accordance with the presently disclosed subject matter.

In the following detailed description, numerous specific details are set forth in order to provide a thorough understanding of the presently disclosed subject matter. However, it will be understood by those skilled in the art that the presently disclosed subject matter may practiced without these specific details. In other instances, well-known methods, procedures, and components have not been described in detail so as not to obscure the presently disclosed subject matter.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as "obtaining", "grouping", "employing", "compressing", "generating", "omitting", "adding", "identifying", "associating", "counting", "replacing", "truncating", "including", "determining", "padding", "updating" or the like, include action and/or processes of a computer that manipulate and/or transform data into other data, said data represented as physical quantities, e.g. such as electronic quantities, and/or said data representing the physical objects. The terms "computer", "processor", and "controller" should be expansively construed to cover any kind of electronic device with data processing capabilities, including, by way of non-limiting example, a personal desktop/laptop computer, a server, a computing system, a communication device, a smartphone, a tablet computer, a smart television, a processor (e.g. digital signal processor (DSP), a microcontroller, a field programmable gate array (FPGA), an application specific integrated circuit (ASIC), etc.), a Graphics Processing Unit (GPU), group of multiple physical machines sharing performance of various tasks, virtual servers co-residing on a single physical machine, any other electronic computing device, and/or any combination thereof.

The operations in accordance with the teachings herein may be performed by a computer specially constructed for the desired purposes or by a general-purpose computer specially configured for the desired purpose by a computer program stored in a non-transitory computer readable storage medium. The term "non-transitory" is used herein to exclude transitory, propagating signals, but to otherwise include any volatile or non-volatile computer memory technology suitable to the application.

As used herein, the phrase "for example," "such as", "for instance" and variants thereof describe non-limiting embodiments of the presently disclosed subject matter. Reference in the specification to "one case", "some cases", "other cases" or variants thereof means that a particular feature, structure or characteristic described in connection with the embodiment(s) is included in at least one embodiment of the presently disclosed subject matter. Thus, the appearance of the phrase "one case", "some cases", "other cases" or variants thereof does not necessarily refer to the same embodiment(s).

It is appreciated that, unless specifically stated otherwise, certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable sub-combination.

Figure 2:
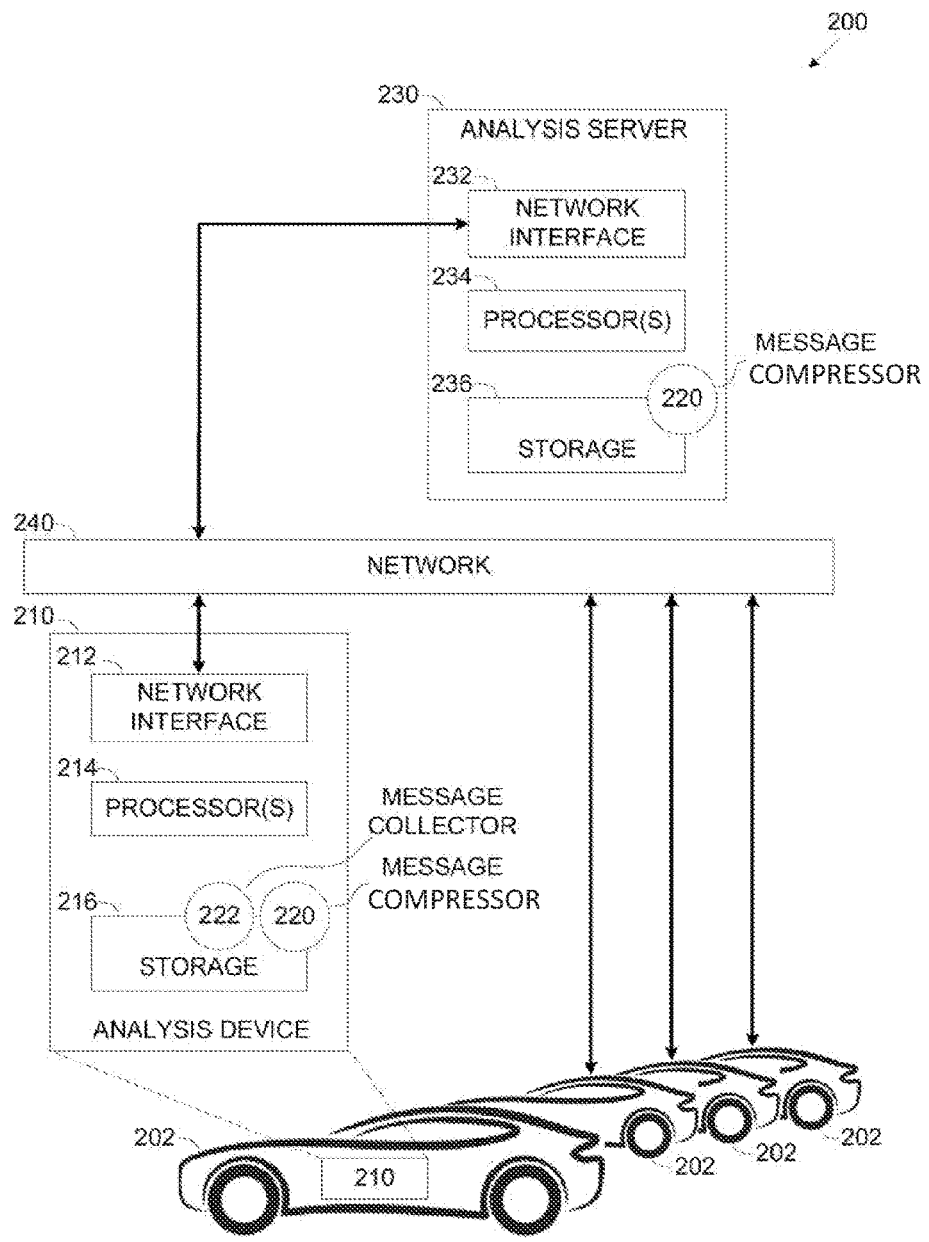
FIG. 2 is a schematic illustration of an operational environment of a system for compressing Controller Area Network (CAN) messages, in accordance with the presently disclosed subject matter.
Figure 3:
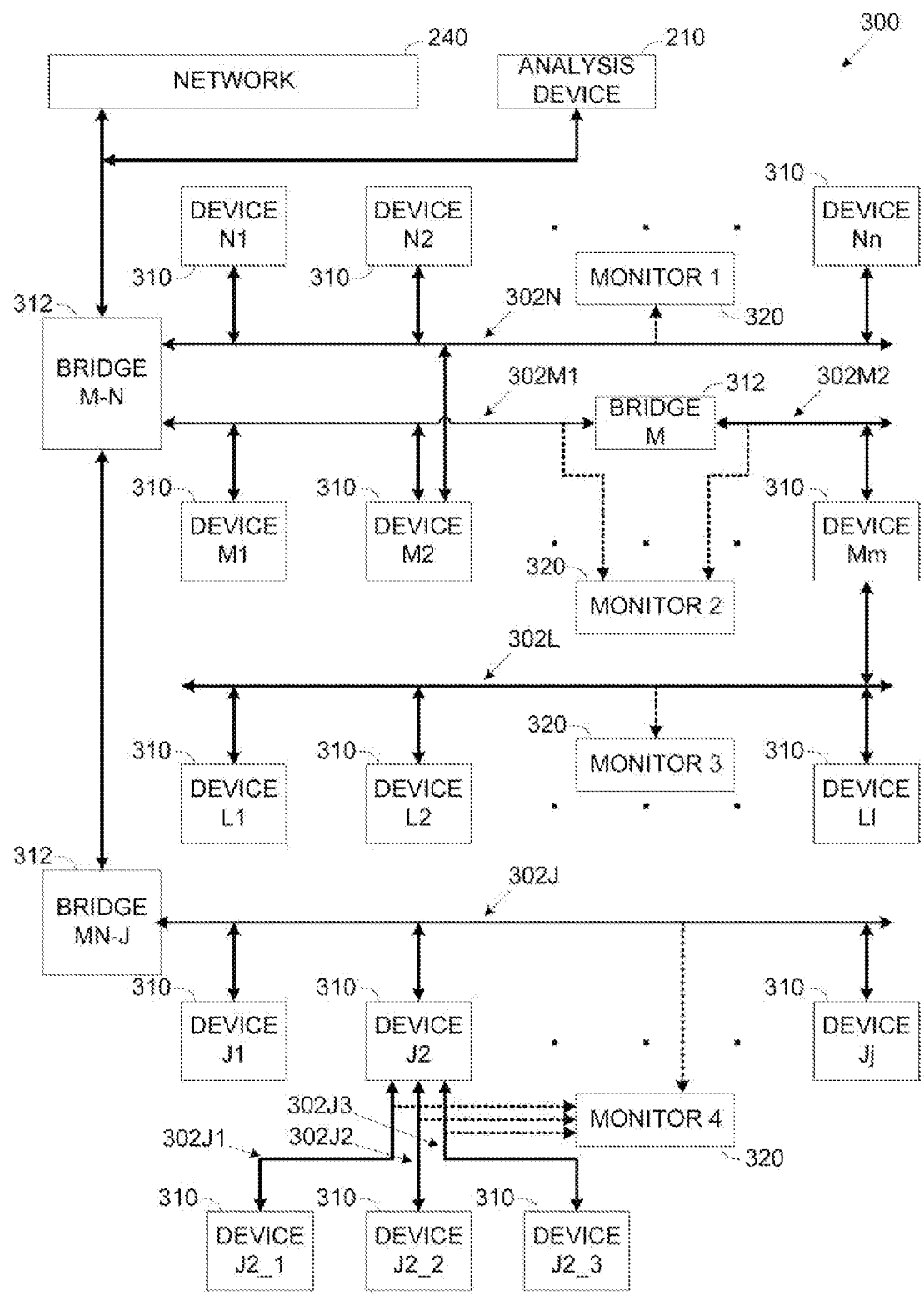
FIG. 3 is a schematic illustration of an exemplary system for intercepting communication messages exchanged over communication channels of a vehicle, in accordance with the presently disclosed subject matter.
Figure 4:
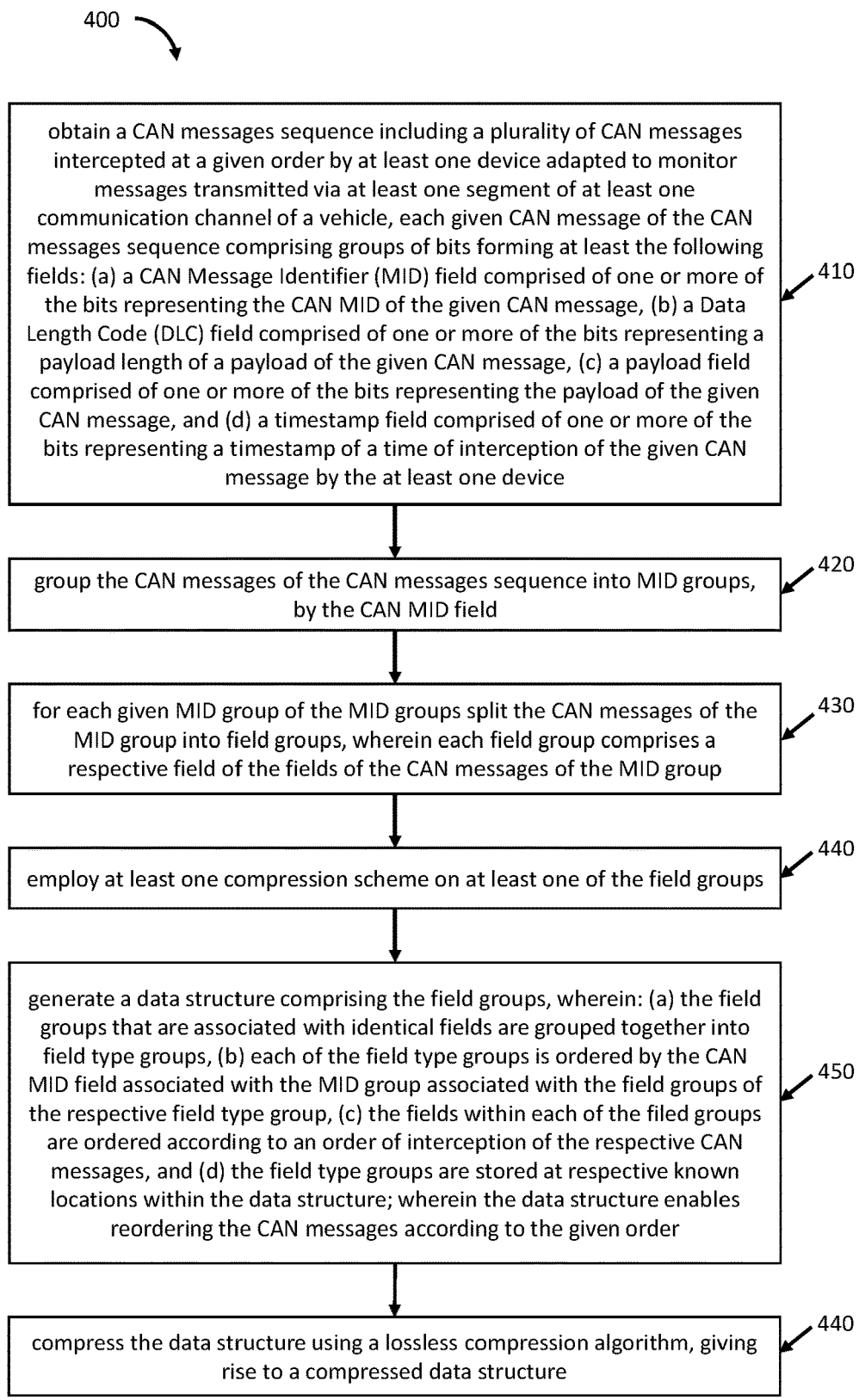
FIG. 4 is a flowchart illustrating one example of a sequence of operations carried out for compressing for Controller Area Network (CAN) messages, in accordance with the presently disclosed subject matter.

In embodiments of the presently disclosed subject matter, fewer, more and/or different stages than those shown in FIG. 4 may be executed. In embodiments of the presently disclosed subject matter one or more stages illustrated in FIG. 4 may be executed in a different order and/or one or more groups of stages may be executed simultaneously. FIGS. 1-3 illustrate a general schematic of the system architecture in accordance with an embodiment of the presently disclosed subject matter. Each module in FIGS. 1-3 can be made up of any combination of software, hardware and/or firmware that performs the functions as defined and explained herein. The modules in FIGS. 1-3 may be centralized in one location or dispersed over more than one location. In other embodiments of the presently disclosed subject matter, the system may comprise fewer, more, and/or different modules than those shown in FIGS. 1-3.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Bearing this in mind, attention is drawn to FIG. 1, a block diagram schematically illustrating one example of a system for compressing Controller Area Network (CAN) messages, in accordance with the presently disclosed subject matter.

According to certain examples of the presently disclosed subject matter, there is provided a system 100 configured to compress CAN messages. It is to be noted that whenever reference is made to CAN messages, any type of CAN messages that meet the CAN bus protocol, or any extension thereof is contemplated, including, for example, CAN FD (CAN with Flexible Data-Rate), or any other type of CAN messages.

For this purpose, System 100 can comprise, or be otherwise associated with, a data repository 120 (e.g. a database, a storage system, a memory including Read Only Memory ROM, Random Access Memory—RAM, or any other type of memory, etc) configured to store data, including, inter alia one or more intercepted CAN messages for compression, and/or compressed representations of CAN messages that can be decompressed, e.g. upon request.

System 100 can comprise a network interface 130 enabling connecting system 130 to various networks such as the Internet and enabling it to send and receive data sent thereto via the networks. As further detailed herein, in some cases, system 100 can compress CAN messages and send the compressed representations thereof to external entities over the network.

System 100 further comprises a processing resource 110. Processing resource 110 can include one or more processing units (e.g. central processing units, Graphics Processing Units (GPUs)), microprocessors, microcontrollers (e.g. microcontroller units (MCUs)), or any other computing processing device, which are adapted to independently or cooperatively process data for controlling relevant system 100 resources and for enabling operations related to system 100 resources.

The processing resource 110 comprises a message compressor module 220, configured to compress CAN messages, as further detailed herein, inter alia with reference to FIG. 4.

Turning to FIG. 2, there is shown a schematic illustration of an operational environment of a system fix compressing Controller Area Network (CAN) messages, in accordance with the presently disclosed subject matter.

An exemplary system 200 may include one or more vehicles 202 such as, a car, a truck, a motorcycle, a bus, a train, an airplane, a drone, a boat, and/or the like. According to some embodiments of the presently disclosed subject matter one or more of the vehicles 202 includes a respective analysis device 210 (that can optionally be system 100) adapted to execute a process for compressing CAN messages, e.g. in order to reduce the bandwidth required to transmit the CAN messages to an external entity over a network 240, as further detailed herein, inter alia with reference to FIG. 4, However, according to some embodiments of the presently disclosed subject matter the process for compressing CAN messages is executed by a remote analysis server 230 for one or more vehicles 202, so that CAN messages received thereby consume less storage space. In such cases, the data including the CAN messages for compression can be stored on a removable storage device of the vehicles 202 and provided to the remote analysis server 230 occasionally, by removing the removable storage device from the vehicles 202 and exporting the data to remote analysis server 230 (e.g. by connecting it to the remote analysis server 230 and copying the data.). In other cases, the vehicles 202 can be operatively connected to the remote analysis server 230 via a network 240 comprising one or more wired and/or wireless networks, for example, a Radio Frequency (RF) link, a LAN, a WLAN, a Wide Area Network (WAN), a Municipal Area Network (MAN), a cellular network, the internet and/or the like, which enables the vehicles 202 to send the data to the remote analysis server 230 via the network. The connection can be a real time connection through which CAN messages intercepted on the vehicle's 202 communication channels are immediately sent to the remote analysis server 230. Optionally, in some embodiments, the connection can be a non-real-time connection so that CAN messages intercepted on the vehicle's 202 communication channels are stored on a buffer and sent to the remote analysis server 230 periodically, in cases where one or more vehicles 202 are not continuously connected to the remote analysis server 230 but rather connect to the remote analysis server 230 occasionally, periodically and/or the like. For example, a certain vehicle 202 may connect to the remote analysis server 230 when parked in a certain parking space, for example, at home, at a work place and/or the like. Moreover, a certain vehicle 202 may take advantage of networking capabilities and/or infrastructures provided by the parking space, for example, connectivity to the network 240. In such case, the certain vehicle 202 may connect to the parking space network infrastructure, for example, a wireless router (e.g. Wi-Fi router) serving as a gateway to provide access to the network 240 and through it to the analysis server 230.

The analysis device 210 may include a network interface 212 to provide connectivity for the vehicle 202, a processor(s) 214 for executing a process such as a process for compressing CAN messages, and storage 216 for storing program code (serving as program store program store) and/or data. The network interface 212 may include one or more wired and/or wireless network interfaces for connecting to the network 240. The processor(s) 214, homogenous or heterogeneous, may include one or more processing nodes arranged for parallel processing, as clusters and/or as one or more multi core processor(s). The storage 216 may include one or more non-transitory memory devices, either persistent non-volatile devices, for example, a hard drive, a solid-state drive (SSD), a magnetic disk, a Flash array and/or the like and/or volatile devices, for example, a Random-Access Memory (RAM) device, a cache memory and/or the like.

The processor(s) 214 may execute one or more software modules, for example, a process, a script, an application, an agent, a utility, a tool and/or the like each comprising a plurality of program instructions stored in a non-transitory medium such as the storage 216 and executed by one or more processors such as the processor(s) 214, For example, the processor(s) 214 may execute a message compressor module 220 for executing a process for compressing CAN messages.

In case the process for compressing CAN messages is executed by the remote analysis server 230, the processor(s) 214 may execute a message collector module 222 for collecting intercepted messages exchanged over one or more communication channels of the vehicle 202. The message collector 222 may further transmit the intercepted messages and/or part thereof to the remote analysis server 230 via the network interface 212 connected to the network 240. In some cases, in order to differentiate between the different vehicles 202, the vehicles 202 Vehicle Identification Numbers (VINs) are used.

The remote analysis server 230 may include a network interface 232 such as the network interface 212 or network interface 130 to provide connectivity for the remote analysis server 230, a processor(s) 234 such as the processor(s) 214 or processing resource 110 for executing a process such as the process for compressing CAN messages and storage 236 such as storage 216 or data repository 120 for storing program code (serving as program store program store) and/or data. Similarly to the storage 216 and data repository 120, the storage 236 may include one or more non-transitory memory devices, either persistent non-volatile devices, for example, a hard drive, a solid state drive (SSD), a magnetic disk, a Flash array and/or the like and/or volatile devices, for example, a Random-Access Memory (RAM) device, a cache memory and/or the like. The storage 236 may further comprise one or more network storage devices, for example, a storage server, a network accessible storage (NAS), network drive, and/or the like.

The processor(s) 234 may execute one or more software modules, for example, a process, a script, an application, an agent, a utility, a tool and/or the like. For example, the processor(s) 234 may execute a message compressor module such as the message compressor module 220 for executing the process for compressing CAN messages.

Optionally, the remote analysis server 230 and/or the analyzer 220 executed by the remote analysis server 230 are provided, partially, or entirely, as one or more cloud computing services, for example, Infrastructure as a Service (IaaS), Platform as a Service (PaaS), Software as a Service (SaaS) and/or the like such as, for example, Amazon Web Service (AWS), Google Cloud, Microsoft Azure, IBM Cloud, and/or the like.

Reference is now made to FIG. 3, which is a schematic illustration of an exemplary system for intercepting communication messages exchanged over communication channels of a vehicle, in accordance with the presently disclosed subject matter.

An exemplary system 300 may be deployed in a vehicle such as the vehicle 202 for intercepting messages exchanged between a plurality of devices 310 deployed in the vehicle 202 for collecting data relating to the operation of the vehicle 202 and/or for controlling one or more functions and or systems of the vehicle 202. The devices 310 may include for example, sensor(s), ECU(s), I/O controller(s), communication controller(s) and/or the like. The topology and deployment of the system 300 is exemplary and should not be construed as limiting since multiple other deployments, topologies and/or layouts may be implemented as known in the art.

The sensors may include one or more sensors, for example, an engine operation sensor, an environmental condition sensor (e.g. temperature sensor, a light sensor, a humidity sensor, etc.), a navigation sensor (e.g. a Global Positioning System (GPS) sensor, an accelerometer, a gyroscope, etc.), an imaging sensor (e.g. a camera, a night vision camera, a thermal camera, etc.) and/or the like. The ECUs may include one or more processing units and/or controllers adapted to operated, control and/or execute one or more functions of the vehicle 202, for example, steering, accelerating, breaking, parking, information collection, safety system control, multimedia system control, door control, window control and/or the like. The I/O controllers may include one or more controllers adapted to connect to one or more of the sensors, the ECUs and/or the like. The I/O controllers may include one or more controllers adapted to operate one or more user interfaces, for example, a pointing device, a keyboard, a display, an audio interface and/or the like. The communication controllers may include one or more controllers adapted to connect to the network 240. Optionally, one or more of the devices 310 may be integrated devices comprising one or more of the sensors, the ECUs, the I/O controllers, the communication controllers and/or the like.

The devices 310 may communicate with each other by sending messages over one or more wired and/or wireless (vehicle) communication channels 302 deployed in the vehicle 202, for example, CAN bus, UN, FlexRay, LAN, Ethernet, automotive Ethernet, WLAN (e.g. Wi-Fi), WCAN, MOST and/or the like. The topology of the system may vary and may include a plurality of communication channels 302 of various types and various topologies (e.g. bus, point-to-point, multi-drop, etc.) which may be further segmented. By deploying specific types of communication channels 302 and optionally segmenting one or more of them, the topology of the system 300 may be adapted to accommodate one or more needs, constraints and/or objectives of the system 300, for example, apply segregated domain(s) for sensitive devices 310, adapt to deployment physical limitation(s) of the vehicle 202 (e.g. limited space, long distances, etc.), create a hierarchical structure(s) for at least some of the devices 310 and/or the like.

For example, one or more devices 310, for example, a device 310 N1, a device 310 N2 through device 310 Nn may connect to a communication channel 302N, for example, a LIN, in another example, one or more devices 310, for example, a device 310 M1, a device 310 M2 through device Mm may connect to a segmented communication channel 302M, for example, a CAN bus comprising two CAN bus segments 302M1 and 302M2. In another example, one or more devices 310, for example, a device 310 L1, a device 310 L2 through device 310 L1 may connect to a communication channel 302L, for example, a MOST. In another example, one or more devices 310, for example, a device 310 J1, a device 310 J2 through a device 310 Jj may connect to a communication channel 302J, for example, a Wi-Fi network.

The system 300 may further include one or more bridges 312 adapted to connect between communication channels 302 of different types and/or between segments of one or more of the communication channels 302. The bridges 312 may transfer one or more messages from one communication channel 302 to another communication channels 302 in one or both directions to allow propagation of messages between the communication channels 302. Naturally, each bridge 312 includes the appropriate interfaces and/or ports for connecting to the respective communication channels 302 it connects to. For example, a bridge 312 M-N may connect the communication channel 302N and the communication channel 302M. In another example, a bridge 312 MN-J may connect the communication channels 302N and 302M with the communication channels 302J. In another example, a bridge 312 M may connect between the segments 302M1 and 302M2 of the communication channels 302M.

One or more of the devices 310 may also serve as a bridge 312. For example, the device 310 Mm may bridge between the communication channel 302M, specifically the segment 302M2 of the communication channel 302M and the communication channel 302L. In another example, the device 310 J2 may serve as a bridge 312 for connecting a device 310 J2_1, a device 310 J2_2 and/or a device 310 J2_3 to the communication channel 302J where the device 310 J1 connects to the device 310 J2 through a communication channel 302 J1, the device 310 J2 connects to the device 310 J2 through a communication channel 302 J2 and the device 310 J3 connects to the device 310 J2 through a communication channel 302 J3. The communication channels 302 J1, 302 J2 and/or 302 J2 may be of the same type and/or of different types.

The system 300 may further include one or more monitoring devices 320 for monitoring and intercepting communication, specifically messages exchanged between the devices 310 over the communication channels 302. The system 300 may include a central monitor 320 which may connect to a plurality of the communication channels 302. However, the system 300 may include a plurality of monitors 320, for example, a monitor 1 320 which monitors the communication channel 302N, a monitor 2 320 which monitors the communication channel 302M specifically the segments 302M1 and 302M2, a monitor 3 320 which monitors the communication channel 302I, a monitor 4 320 which monitors the communication channel 302J and/or the like. The monitor 4 320 may further monitor one or more of the communication channels 302J1, 302J2 and/or 302J3. One or more of the monitors 320 may be integrated in one or more of the devices 310 and/or the bridges 312 such that in addition to its normal operation the integrated device 310 or the integrated bridge 312 may monitor and intercept messages transmitted on the respective communication channel(s) 302 it connects to. According to some embodiments of the present invention, the monitors 320 are receive-only devices which are only capable of intercepting (receiving) the messages transmitted on the communication channel(s) 302 while unable to transmit messages or affect the communication channel(s) 302 in any way. However, in some cases, one or more of the monitors 320 may optionally be configured as active devices that can inject data to the communication channels (or to parts thereof), or manipulate data injected therethrough to the communication channels. This can enable, for example, correcting anomalous messages, preventing anomalous messages from being transmitted over the designated communication channels, etc.

The monitoring device(s) 320 adapted to intercept the messages exchanged over the communication channels 302 may optionally be configured as passive receiver-only device incapable of injecting data to the communication channels 302. Furthermore, the monitoring device(s) 320 may be coupled to the communication channels 302 in an isolated manner thus incapable of inducing, altering, manipulating and/or otherwise affecting the transmission signals of the communication channels 302 in any way. For example, one or more of the monitoring devices 320 may include one or more sensing wires wrapped around one or more insulated wires of one or more of the communication channels 302 such that the sensing wire(s) are incapable of injecting data, messages and/or signals to the communication channel(s) 302. By analyzing the electric load, current and/or voltage of the signals travelling (propagating) through the insulated wires of the communication channel(s) 302 as sensed by the sensing wire(s), the monitoring device(s) 320 may detect messages exchanged over the communication channel(s) 302 and intercept them. In another example, one or more of the monitoring devices 320 may include a wireless receiver-only capable of intercepting wireless messages exchanged between one or more of the devices 210 while incapable of transmitting messages.

In order to be able to correlate the intercepted messages with time and/or space attributes, the monitoring device(s) 320 may assign metadata to one or more of the intercepted messages which may naturally be intercepted at different communication channels 302 at different times. The metadata assigned to the intercepted message(s) may include, for example, a time tag (also referred to herein as "timestamp") indicating a time of interception of the respective message, a source communication channel 302 where the respective message is intercepted and/or the like. The metadata assigned to the intercepted messages may be used to correlate messages intercepted at various times and/or locations (communication channels 302) to create one or more time continuum and/or space continuum meta-events.

The intercepted messages may be transferred (exported) to the analysis server 230 and/or to the analysis device 210 for compression.

One or more of the devices 310 may be adapted to control a network interface such as the network interface 212 for connecting to a network such as the network 240 to transmit the intercepted messages to the analysis server 230.

The system 300 may further include an analysis device such as the analysis device 210 which may receive the intercepted messages from the monitor(s) 320 and compress them.

Turning to FIG. 4, there is shown a flowchart illustrating one example of a sequence of operations carded out for compressing for Controller Area Network (CAN) messages, in accordance with the presently disclosed subject matter.

According to the presently disclosed subject matter, the message compressor module 220 can be configured to perform a CAN messages compression process 400, during which it is configured to compress CAN messages generated during operation of a vehicle. Before turning to describe the CAN messages compression process 400, it is to be noted that although reference is made herein to vehicles CAN messages, this is by no means limiting, and the teachings herein can be applied to other types of messages that are transmitted over any of the communications channel(s) 302 of the vehicle 202, and optionally also on other, non-vehicular environments.

The CAN messages compression process 400 is performed on bulks of CAN messages. In case the CAN messages for compression are CAN messages intercepted over a vehicle's CAN bus during the vehicle's operation, CAN messages are continuously intercepted over the CAN bus, and such CAN messages can be stored on a buffer. In such cases, the CAN messages compression process 400 can be performed on bulks of CAN messages stored on the buffer, also referred to herein as CAN messages sequences. It is to be noted however, that the bulks of CAN messages can be obtained in any other manner, and not necessarily by real-time interception thereof over a given vehicle's CAN bus. In some cases, each bulk can include tens/hundreds/thousands/tens thousands/hundreds of thousands, or more CAN messages. It is to be noted in this respect that there is a tradeoff between the latency (the time that will pass until compressed messages are transmitted to their destination) and compression, as the more CAN messages each bulk contains will result in better compression, while the latency increases as collecting more CAN messages requires more time. In some cases, collecting 100,000 CAN messages to a bulk can take about 30-60 seconds.

Accordingly, the message compressor module 220 obtains a CAN messages sequence (i.e. a bulk of CAN messages) for compression (block 410). The CAN messages sequence includes a plurality of CAN messages intercepted at a given order by at least one device adapted to monitor messages transmitted via at least one segment of at least one communication channel of a vehicle. Each CAN message of the CAN messages sequence comprises bits forming at least the following fields:

(a) a CAN Message Identifier (MID) field (noting that in the CAN bus protocol the MID field is also referred to as "arbitration ID" field or a message type field) comprised of bits representing the CAN MID of the given CAN message;

(b) a payload field comprised of bits representing the payload of the given CAN message (noting that in some cases, the payload can be empty);

(c) a Data Length Code (DLC) field comprised of bits representing the length of the payload within the payload field (noting that the length can be indicated as a number of bytes comprising t be payload); and (d) a timestamp field comprised of bits representing a timestamp of a time of interception of the given CAN message by the at least one device.

Having obtained the CAN messages sequence, the message compressor module 220 groups the CAN messages of the CAN messages sequence into groups, according to the CAN MIDs of the CAN messages (block 420). Each CAN message that is transmitted over the vehicle's CAN bus has a corresponding message type. As indicated be rein, each CAN message comprises a CAN MID field which is comprised of bits that represent the message type (also referred to, interchangeably, as CAN MID) of the CAN message.

Assuming that the CAN messages sequence obtained at block 410 includes a plurality of CAN messages of type A (i.e. CAN messages having a first value in the CAN MID field indicating that the CAN messages are of type A), a plurality of CAN messages of type B (i.e. CAN messages having a second value in the CAN MID field indicating that the CAN messages are of type B), a plurality of CAN messages of type C (i.e. CAN messages having a third value in the CAN MID field indicating that the CAN messages are of type C), and a plurality of CAN messages of type D (i.e. CAN messages having a fourth value in the CAN MID field indicating that the CAN messages are of type D), so that the CAN messages of types A, B, C and D are interleaved within the CAN messages sequence (i.e. the sequence is not arranged so that all messages of type A appear before all messages of type B, which in turn appear before all messages of type C, which in turn appear before all messages of type D), the grouping performed at block 420 results in having a first group that comprises all of the messages of type A, a second group comprising all of the messages of type B, a third group comprising all of the messages of type C and a fourth group comprising all of the messages of type D. It is to be noted that this is a mere example, and in at least some scenarios there are more than four message types, and in some specific cases there are tens/hundreds/thousands message types or even more. In the following description, the groups generated by the grouping performed at block 420 are also referred to as MID groups, where each MID group is a group of CAN messages having the same value in their CAN MID field (i.e. each MID group comprises CAN messages of the same type).

After grouping the CAN messages sequence obtained at block 410 to the MID groups at block 420, the message compressor module 220 splits the CAN messages within each MID group into field groups, so that each field group comprises a respective field of the fields of the CAN messages of the respective MID group (block 430). As indicated herein, the CAN messages within the CAN messages sequence to be compressed, comprise four fields, namely CAN MID, payload, DLC and timestamp fields. It is to be noted that this is by no means limiting, and in some cases the CAN messages for compression can include additional, or alternative fields, mutates mutandis.

Accordingly, for each MID group four field groups are created: all of the CAN MID fields of the CAN messages within the MID group are grouped into a MID field group, all of the payload fields of the CAN messages within the MID group are grouped into a payload field group, all of the DLC fields of the CAN messages within the MID group are grouped into a DLC field group, and all of the timestamp fields of the CAN messages within the MID group are grouped into a timestamp field group.

Looking at a simple example, assuming that the can messages sequence includes a group of ten CAN messages of type A (i.e. ten CAN messages having a first value in the CAN MID field indicating that the CAN messages are of type A), each of the ten CAN messages includes the four fields (namely CAN MID, payload, DLC and timestamp fields). The splitting results in grouping of: all of the CAN MID fields of the CAN messages of type A, all of the payload fields of the CAN messages of type A, all of the DLC fields of the CAN messages of type A, and all of the timestamp fields of the CAN messages of type A—into four respective groups: MID field group (comprising all of the CAN MID fields of the messages of type A within the CAN messages sequence), payload field group (comprising all of the payload fields of the messages of type A within the CAN messages sequence), DLC field group (comprising all of the DLC fields of the messages of type A within the CAN messages sequence), and timestamp field group (comprising all of the timestamp fields of the messages of type A within the CAN messages sequence). This is performed for all MID groups of all message types.

Having the field groups, the message compressor module 220 employs at least one compression scheme on at least one of the field groups associated with each MID group (block 440). Several exemplary compression schemes are provided herein below. The compression schemes are all aimed at reducing the sizes of the field groups on which they are employed.

The message compressor module 220 is further configured to generate a data structure comprising the field groups (including at least one field group on which a compression scheme was employed at block 440), in a manner that enables reordering the CAN messages according to the given order of their interception (block 450).

In some cases, the data structure is generated so that:

(a) the field groups that are associated with identical fields are grouped together into field type groups. Assuming that the CAN messages sequence obtained at block 410 includes CAN messages of types A, B, C, and D, which are grouped into MID groups at block 420, and each MID group is split to four field groups (MID field groups, payload field groups, DLC field groups and timestamp field groups), the data structure is generated so that the field groups are grouped together in the data structure. In other words, the MID field groups of the MID groups are grouped, the payload field groups of the MID groups are grouped, the DLC field groups of the MID groups are grouped, and the timestamp field groups of the MID groups are grouped.

(b) each of the field type groups is ordered by the CAN MID field associated with the MID group associated with the field groups of the respective field type group. Each field group is split from a respective MID group, grouped by the CAN MID fields of the CAN messages sequence, and accordingly, within each field type group (which comprises field groups split from a plurality of MID groups), the field groups are ordered by the CAN MID field of the CAN messages of the MID group from which they were split.

(c) the fields within each of the filed groups are ordered according to an order of interception of the respective CAN messages. Accordingly, the fields within each field group are required to be ordered by the order of interception of the CAN messages from which the fields are split.

(d) the field type groups are stored at respective known locations within the data structure.

The message compressor module 220 is further configured to compress the data structure using a lossless compression algorithm, giving rise to a compressed data structure. Some exemplary lossless compression algorithms that can be used to compress the data structure include: Lempel-Ziv (LZ), Lempel-Ziv-Welch (LZW), Deflate, Lempel-Ziv-Oberhumer (LZO), Lempel-Ziv-Markov chain Algorithm (LIMA), Lempel-Ziv-Storer-Szymanski (LZSS), Broth, Zstandard, however, any other lossless compression algorithm can be used as well.

The compressed data structure can be sent over a network connection thereby reducing bandwidth requirements in comparison to sending the CAN messages sequence without performing the CAN messages compression process 400. Alternatively, or additionally, this enables reducing the storage space requirements as storage of the compressed data structure requires less space in comparison to storing the CAN messages sequence without performing the CAN messages compression process 400.

Before turning to describe some exemplary compression schemes, it is to be noted that in some cases, the CAN messages sequence can include time conflicting messages. Time conflicting messages are CAN messages that have an identical timestamp, from various reasons (e.g. two different CAN messages were intercepted by two different respective monitors 320 at the same time and were therefor assigned with an identical timestamp). It is to be further noted that the messages still arrive at the buffer in a given order, and such order is to be maintained also when compressing the CAN messages. In such cases, the message compressor module 220 can be configured to identify, within the CAN messages sequence, groups of time conflicting messages, if any, each group comprises CAN messages of the CAN messages sequence having identical timestamps. The message compressor module 220 associates, within the data structure for at any other location accessible by an entity, such as a decompressor, that is configured to reconstruct the compressed data structure upon decompression thereof), each of the time conflicting messages, with a respective index indicative of an order of interception of the time conflicting messages on the communication channel. This index enables reordering the CAN messages according to the CAN messages interception time upon decompressing the compressed data structure while resolving conflicts between the CAN messages having the identical timestamps.

Attention is now drawn to some exemplary compression schemes that can be employed, as mentioned with reference to block 440. Reference will be made here to compression schemes that can be employed on different field groups, starting with the MID field group.

In some cases, a simple Run Length Compression (RLC) compression can be employed on the MID field groups. For this purpose, the message compressor module 220 can count a number of elements in each MID field group of the MID field groups. The number of elements within each MID field group is referred to as a CAN MID counter, and such CAN MID counter is determined for each MID field group. Having the CAN MID counters, the message compressor module 220 replaces the elements in each MID field group of the MID field groups with a selected element of the elements and the respective CAN MID counter indicative of a number of elements identical to the selected element. This enables reconstructing the MID field group upon decompressing the compressed data structure.

Looking at an illustrative example, assuming that a given MID field group comprises ten elements, each having the same value "A": ["A", "A", "A", "A", "A", "A", "A", "A", "A", "A"], this can be compressed to a representation that includes a single element (as all elements are equal) and an indication of the number of elements that exist within the MID field group. Accordingly, after employing the compression scheme, the MID field group can change to: ["A", "10"], indicating that the value of each element is "A" and ten elements exist.

Turning to the DLC field group:

The message compressor module 220 can perform a constant length compression, in which it is configured to identify, within the MID groups (or within the DLC field group split therefrom), constant length groups being the MID groups comprised of CAN messages that all have an identical value in the DLC field. For each constant length group, the message compressor module 220 can add to the corresponding MID field group an indication of the identical value and delete all elements of the respective DLC field groups. This enables reconstructing the DLC field group upon decompressing the compressed data structure.

Looking at the illustrative example, provided with reference to the RLC, assuming that a given DLC field group associated with the MID group comprised of CAN messages of type "A" comprises ten elements, each having the same value "1" (indicating that the payload field of such CAN messages is always one byte): ["1", "1", "1", "1", "1", "1", "1", "1", "1", "1"], this can be compressed to a representation that includes a single element within the MID field group. Accordingly, after employing the compression scheme, the MID field group can change to: ["A", "10", "1"], indicating that the ten CAN messages of type "A" exist, and the length of the payloads within such CAN messages of type "A" is one byte. Accordingly, the RLC compression can be accompanied by the DLC field group compression detailed herein above.

The message compressor module 220 can perform a non-constant length compression, in which it is configured to identify, within the MID groups, non-constant length groups being the MID groups comprised of CAN messages that do not have an identical value in the DLC field. For each of the non-constant length groups the message compressor module 220 can be configured to: (a) identify a most frequent value in the DLC field of the CAN messages within the non-constant length group, (b) add to the corresponding MID field group an indication of the most frequent value, and (c) replace all elements of the respective DLC field groups whose values are equal to the most frequent value with a default value indication (that can optionally be represented by a single bit). This enables reconstructing the DLC field group upon decompressing the compressed data structure.

In some cases, as an alternative to replacing all elements of the respective DLC field groups whose values are equal to the most frequent value with a default value indication, the message compressor module 220 can omit all elements of the respective DLC field groups whose values are equal to the most frequent value and add a list of exceptions indicative of the positions of the elements of the respective DLC field groups whose values are not equal to the most frequent value. This enables reconstructing the DLC field group upon decompressing the compressed data structure. Looking at an illustrative example, assuming that a DLC field group includes the following elements: ["7", "3", "7", "7", "7", "12", "7", "7", "7"]. The most frequent value is "7". According to the suggested compression scheme, all of the elements having the value "7" are omitted, so that the DLC field group, after the omission, includes the following elements: ["3", "12"], and the list of exceptions includes the following values: 2, 6 indicating the position of the elements that are not of the most frequent values, is added to the data structure (or otherwise provided to an entity that is configured to reconstruct the compressed data structure upon decompression thereof).

Turning to compression schemes that can be employed on the timestamp field group:

The message compressor module 220 can perform a Least Significant Bits (LSB) resolution reduction, in which it is configured to truncate one or more least significant bits of the timestamps of each timestamp in the field groups associated with the timestamp field, in some cases, the accuracy of the timestamp can be reduced, as very high accuracy is not necessarily required, and in many cases the least significant bits are just noise caused by the inaccuracy of the recording devices.

It is to be noted however, that in some cases, upon truncating one or more of the least significant bits of the timestamp fields, new time conflicting messages (having identical timestamps) can be identified. In such cases, the message compressor module 220 can be configured to identify, within the CAN messages sequence, groups of time conflicting messages, if any, each group comprises CAN messages of the CAN messages sequence having identical timestamps (following the truncation). The message compressor module 220 associates, within the data structure (or at any other location accessible by an entity, such as a decompressor, that is configured to reconstruct the compressed data structure upon decompression thereof), each of the time conflicting messages, with a respective index indicative of an order of interception of the time conflicting messages on the communication channel. This index enables reordering the CAN messages according to the CAN messages interception time upon decompressing the compressed data structure while resolving conflicts between the CAN messages having the identical timestamps.

The message compressor module 220 can perform, additionally, or alternatively, to the LSB compression detailed herein, a time difference compression, in which it is configured to compress the timestamp field groups using time differences between interception times of CAN messages.

For this purpose, message compressor module 220 generates, for each CAN message of the CAN messages sequence, an exception indication. The exception indication generated by the message compressor module 220 indicates if a number of bits required to represent a time difference between the timestamp indicative of interception time of the respective CAN message and the timestamp indicative of interception time of a preceding CAN message preceding the respective CAN message in the CAN messages sequence, if any (as the first message in the CAN message sequence does not have a preceding CAN message), is larger than a bit number threshold (that is smaller than the number of bits representing the timestamp). Such exceptions can be treated by simply not performing a manipulation thereof (i.e. not changing their values to the time difference).

For each CAN message of the CAN messages sequence, having the exception indication indicating that the number of bits required to represent the time difference between interception of the respective CAN message and the preceding CAN message preceding the respective CAN message in the CAN messages sequence is smaller than, or equal to, the bit number threshold, message compressor module 220 replaces the timestamp of the respective CAN message with bits representing the time difference between interception of the respective CAN message and the preceding CAN message preceding the respective CAN message in the CAN messages sequence. This enables reconstructing the respective timestamp upon decompressing the compressed data structure. Accordingly, looking at a simple example, assuming that the time difference between two timestamps in a given timestamp field group is one millisecond, clearly replacing the value of the later timestamp with the difference between it and the earlier timestamp (that, as indicated in the example is one millisecond) will result in compression, as the number of bits required to represent one millisecond is smaller than a number of bits required to represent a timestamp that includes, for example, hours, minutes, seconds, and milliseconds).

It is to be noted that this compression scheme, that is based on determining a time difference between interception times of CAN message, cannot be performed if performing RLC compression of the MID field groups. When storing only the delta time between consecutive CAN messages, it is required to store the full sequence of MIDs as well.

As an alternative to the time difference compression, the message compressor module 220 can perform a time difference from average compression, in which it is configured to compress the timestamp field groups using time differences between interception times of CAN messages and expected interception times thereof.

For this purpose, message compressor module 220 performs the following for each given MID group of the MID groups: (a) determining an average interarrival time of the CAN messages within the given MID group, (b) replacing the timestamp of each CAN message in the given MID group with a difference between the CAN message's timestamp and the CAN message's expected timestamp determined based on the average interarrival time, and (c) adding an indication of the average interarrival time of the CAN messages within the given MID group to the data structure. This enables reconstructing the timestamps upon decompressing the compressed data structure.

Turning to compression schemes that can be employed on the payload field groups:

The message compressor module 220 can perform a constant bits compression, in which it is configured to omit one or more bits of payload field groups that have constant values across the respective payload field groups.

For this purpose, the message compressor module 220 generates, for each payload field group of the payload field groups, a bitmask indicative of (a) constant bits of bits of the payloads within the payload field group, being bits that do not change between the payloads within the payload field group, and (b) non-constant bits of the payloads within the payload field group, being bits that change between the payloads within the payload field group.

Looking at an exemplary payload field group, split from a given MID group, in some cases, all of the payloads in such group (i.e. all of the payloads of all of the CAN messages of the message type of the given MID group) have certain bits that are constant. For example, in some cases, all of the first, second, fourth and fifth bits of the payloads in the exemplary payload field group can be constant, so that they have an identical value between all payloads of the exemplary payload field group.

Having the bitmask for each payload field group, the message compressor module 220 omits from the payloads within the payload field group represented by the bitmask except a first payload within the payload field group, the bits of the payloads within the payload field group that are indicated as constant bits by the bitmask, as they can be reconstructed using the bitmask and the values within the first payload within the payload field group. So, looking at the example, assuming that for the exemplary payload field group the first, second, fourth and fifth bits of the payloads are constant, those bits can be omitted from all of the payloads in the exemplary payload field group, except a first payload (whose bit values can be used to reconstruct the payloads).

The bitmask is added to the data structure (or to any other location accessible by an entity, such as a decompressor, that is configured to reconstruct the compressed data structure upon decompression thereof), thereby enabling reconstructing the payloads upon decompressing the compressed data structure.

As an alternative, instead of keeping the first payload in each payload field group in its entirely, all of the constant bits can be omitted from all of the payloads in each of the payload field groups, while in addition to the bitmask, the values of the constant bits are also added to the data structure (or to any other location accessible by an entity, such as a decompressor, that is configured to reconstruct the compressed data structure upon decompression thereof), thereby enabling reconstructing the payloads upon decompressing the compressed data structure.

In some cases, in addition to the constant bits compression detailed above, or as an alternative thereto, the message compressor module 220 can perform a cyclic bits compression, in which it is configured to omit one or more bits of payload field groups that have constant value patterns across the respective payload field groups.

For this purpose, the message compressor module 220 generates, for each payload field group of the payload field groups, a cyclic bits bitmask indicative of (a) cyclic bits of bits of the payloads within the payload field group, being bits that have respective repeating patterns over the payloads within the payload field group, and (b) non-cyclic bits of the payloads within the payload field group, being bits that do not have a repeating pattern over the payloads within the payload field group.

Looking at an exemplary payload field group, split from a given MID group, in some cases, although certain bits thereof are not constant between all payload fields of the payload field groups, some of the non-constant bits can demonstrate a cyclic behavior over the different payload fields of the exemplary payload field group. For example, in some cases, a given bit has the values ["1", "0", "0", "1"] in the first to fourth payload fields of the exemplary payload field group, and in the fifth to eighth payload fields of the exemplary payload field group, and in the ninth to twelfth payload fields of the exemplary payload field group, and so on, until the last four payload fields of the exemplary payload field group.

Having the cyclic bits bitmask for each payload field group, the message compressor module 220 omits from the payloads within the payload field group the bits of the payloads within the payload field groups that are indicated as cyclic bits by the cyclic bits bitmask, and adds the cyclic bits bitmask and the repeating patterns to the data structure (or to any other location accessible by an entity, such as a decompressor, that is configured to reconstruct the compressed data structure upon decompression thereof). Having the cyclic bits bitmask and the repeating patterns themselves, enables reconstructing the payloads upon decompressing the compressed data structure.

Looking at the example, assuming that for the given hit the pattern that was identified is ["1", "0", "0", "1"], the given bit can be omitted from the payload fields of the exemplary payload field group, and the cyclic bits bitmask that indicates that the given bit is cyclic, along with the indication of the pattern ["1", "0", "0", "1"] is added to the data structure (or to any other location accessible by an entity, such as a decompressor, that is configured to reconstruct the compressed data structure upon decompression thereof).

In some cases, after omitting bits, the message compressor module 220 can pad the payloads in each payload field group, with one or more padding bits to supplement each of the payloads to be of a number of bits that is a multiplication of eight. In some cases, the reason for doing so is that deduplication and lossless compression achieve higher compression with the padded data, as they work on the byte level and not bit level.

In some cases, in addition to the constant bits compression and/or the cyclic bits compression detailed above, or as an alternative thereto, the message compressor module 220 can perform a XOR/Subtract compression.

For this purpose, the message compressor module 220 can be configured to update the payloads within each given payload field group of the payload field groups by performing an XOR operation or a Subtract operation, between each payload of the given payload field group and its preceding payload in the given payload field group, if any (as the first payload in the given payload field group does not have a preceding payload in the given payload field group). Accordingly, XOR/Subtract is performed between the first payload and the second payload, between the second payload and the third payload, between the third payload and the fourth payload, etc.

As an alternative, the XOR operation or the Subtract operation, can be performed between the bits of the payloads positioned at each position and the bits of the payloads positioned at a preceding position preceding the respective position, if any. Accordingly, XOR/Subtract is performed between all of the first bits of the payload and all of the second bits of the payloads, between all of the second bits of the payload and all of the third bits of the payloads, between all of the third bits of the payload and all of the fourth bits of the payloads, etc.

In some cases, in addition to the constant bits compression and/or the cyclic bits compression and/or the XOR/Subtract operation detailed above, or as an alternative thereto, the message compressor module 220 can perform deduplication on the payload field groups, using a hash function. In some cases, the hash function can be a cryptographic hash function. It is to be noted that when using deduplication, both the compressing entity, and the decompressing entity have to have the following shared knowledge: 1. Flow the segmentation of the payloads in the payloads field group is done, 2. What hash function is used (in order to be able to build an identical keys/values dictionary that can be used for deduplicating the data and for reconstructing the data), 3. how to handle collisions (a hash function can potentially map different keys to the same value), and 4. How the cache eviction is done (for example LRU is one possible strategy for eviction of cache).

It is to be noted that although various compression schemes have been disclosed herein, in a specific case, the following compression schemes are employed:

(a) on the timestamp field groups: LSB compression and time difference compression, (b) on the MID field group: RLC compression, (c) on the DLC field group: constant length compression and non-constant length compression, and (d) on the payload field: constant bits compression, cyclic bits compression, padding, XOR/Subtract compression, and deduplication.

It is to be noted that, with reference to FIG. 4, some of the blocks can be integrated into a consolidated block or can be broken down to a few blocks and/or other blocks may be added. Furthermore, in some cases, the blocks can be performed in a different order than described herein. It is to be further noted that some of the blocks are optional. It should be also noted that whilst the flow diagram is described also with reference to the system elements that realizes them, this is by no means binding, and the blocks can be performed by elements other than those described herein.

It is to be understood that the presently disclosed subject matter is not limited in its application to the details set forth in the description contained herein or illustrated in the drawings. The presently disclosed subject matter is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the present presently disclosed subject matter.

It will also be understood that the system according to the presently disclosed subject matter can be implemented, at least partly, as a suitably programmed computer. Likewise, the presently disclosed subject matter contemplates a computer program being readable by a computer for executing the disclosed method. The presently disclosed subject matter further contemplates a machine-readable memory tangibly embodying a program of instructions executable by the machine for executing the disclosed method.

The invention claimed is:

1. A system for compressing Controller Area Network (CAN) messages, the system comprising a processing resource configured to:

obtain a CAN messages sequence including a plurality of CAN messages intercepted at a given order by at least one device adapted to monitor messages transmitted via at least one segment of at least one communication channel of a vehicle, each given CAN message of the CAN messages sequence comprising groups of bits forming at least the following fields: (a) a CAN Message Identifier (MID) field comprised of one or more of the bits representing the CAN MID of the given CAN message, (b) a Data Length Code (DLC) field comprised of one or more of the bits representing a payload length of a payload of the given CAN message, (c) a payload field comprised of one or more of the bits representing the payload of the given CAN message, and (d) a timestamp field comprised of one or more of the bits representing a timestamp of a time of interception of the given CAN message by the at least one device;

group the CAN messages of the CAN messages sequence into MID groups, by the CAN MID field;

for each given MID group of the MID groups split the CAN messages of the MID group into field groups, wherein each field group comprises a respective field of the fields of the CAN messages of the MID group;

employ at least one compression scheme on at least one of the field groups;

generate a data structure comprising the field groups, wherein: (a) the field groups that are associated with identical fields are grouped together into field type groups, (b) each of the field type groups is ordered by the CAN MID field associated with the MID group associated with the field groups of the respective field type group, (c) the fields within each of the filed groups are ordered according to an order of interception of the respective CAN messages, and (d) the field type groups are stored at respective known locations within the data structure; wherein the data structure enables reordering the CAN messages according to the given order; and compress the data structure using a lossless compression algorithm, giving rise to a compressed data structure.

2. The system of claim 1, wherein the compression scheme is employed on field groups associated with the payload field, being payload field groups, and wherein the compression scheme further includes, for each payload field group of the payload field groups:

generating a bitmask indicative of (a) constant bits of hits of the payloads within the payload field group, being bits that do not change between the payloads within the payload field group, and (b) non-constant bits of the payloads within the payload field group, being bits that change between the payloads within the payload field group;

omitting from the payloads within the payload field group except a first payload within the payload field group, the bits of the payloads within the payload field group that are indicated as constant bits by the bitmask; and adding the bitmask to the data structure, thereby enabling reconstructing the payloads upon decompressing the compressed data structure.

3. The system of claim 1, wherein the compression scheme is employed on field groups associated with the payload field, being payload field groups, and wherein the compression scheme further includes, for each payload field group of the payload field groups:

generating a bitmask indicative of (a) constant bits of bits of the payloads within the payload field group, being bits that do not change between the payloads within the payload field group, and (b) non-constant bits of the payloads within the payload field group, being bits that change between the payloads within the payload field group;

omitting from the payloads within the payload field group the bits of the payloads within the payload field groups that are indicated as constant bits by the bitmask; and adding to the data structure (i) the bitmask, and (ii) a value of each of the constant bits, thereby enabling reconstructing the payloads upon decompressing the compressed data structure.

4. The system of claim 1, wherein the compression scheme is employed on the field groups associated with the CAN MID field, being MID field groups, and wherein the compression scheme includes:

counting a number of elements in each MID field group of the MID field groups, giving rise to respective CAN MID counters; and replacing the elements in each MID field group of the MID field groups with a selected element of the elements and the respective CAN MID counter indicative of a number of elements identical to the selected element, thereby enabling reconstructing the MID field group upon decompressing the compressed data structure.

5. The system of claim 1, wherein the compression scheme is employed on the field groups associated with the timestamp field, and wherein the processing resource is further configured to truncate one or more least significant bits of the timestamps of each timestamp in the field groups associated with the timestamp field.

6. The system of claim 1, wherein the processing resource is further configured to perform the following:

generate, for each CAN message of the CAN messages sequence, an exception indication indicating if a number of bits required to represent a time difference between interception of the respective CAN message and a preceding CAN message preceding the respective CAN message in the CAN messages sequence, if any, is larger than a bit number threshold; and for each CAN message of the CAN messages sequence, having the exception indication indicating that the number of bits required to represent the time difference between interception of the respective CAN message and the preceding CAN message preceding the respective CAN message in the CAN messages sequence is smaller than or equal to the bit number threshold, replace the timestamp of the respective CAN message with bits representing the time difference between interception of the respective CAN message and the preceding CAN message preceding the respective CAN message in the CAN messages sequence, thereby enabling reconstructing the respective timestamp upon decompressing the compressed data structure.

7. The system of claim 1, wherein the compression scheme is further employed on field groups associated with the timestamp field, being timestamp field groups, and wherein the compression scheme further includes, for each given MID group of the MID groups:

determining an average interarrival time of the CAN messages within the given MID group;

replacing the timestamp of each CAN message in the given MID group with a difference between the CAN message's timestamp and the CAN message's expected timestamp determined based on the average interarrival time; and adding an indication of the average interarrival time of the CAN messages within the given MID group to the data structure.

8. The system of claim 1, wherein the compression scheme is employed on field groups associated with the payload field, being payload field groups, and wherein the compression scheme further includes:

generating a bitmask indicative of (a) cyclic bits of bits of the payloads within the payload field groups, being hits that have respective repeating patterns over the payloads within the payload field groups, and (b) non-cyclic bits of the payloads within the payload field groups, being bits that do not have a repeating pattern over the payloads within the payload field groups;

omitting from the payloads within the payload field group the bits of the payloads within the payload field groups that are indicated as cyclic bits by the bitmask;

adding the bitmask and the repeating patterns to the data structure, thereby enabling reconstructing the payloads upon decompressing the compressed data structure.

9. The system of claim 1, wherein the compression scheme is employed on field groups associated with the payload field, being payload field groups, and wherein the compression scheme further includes:

updating the payloads within each given payload field group of the payload field groups by performing an XOR operation or a subtract operation, between each payload of the given payload field group and its preceding payload, if any.

10. The system of claim 1, wherein the compression scheme is employed on field groups associated with the payload field, being payload field groups, and wherein the compression scheme further includes:

updating the payloads within each given payload field group of the payload field groups by performing an XOR operation or a subtract operation, between the bits of the payloads positioned at each position and the bits of the payloads positioned at a preceding position preceding the respective position, if any.

11. A method for compressing Controller Area Network (CAN) messages, the method comprising:

obtaining, by a processing resource, a CAN messages sequence including a plurality of CAN messages intercepted at a given order by at least one device adapted to monitor messages transmitted via at least one segment, of at least one communication channel of a vehicle, each given CAN message of the CAN messages sequence comprising groups of bits forming at least the following fields: (a) a CAN Message Identifier (MID) field comprised of one or more of the bits representing the CAN MID of the given CAN message, (b) a Data Length Code (DLC) field comprised of one or more of the bits representing a payload length of a payload of the given CAN message, (c) a payload field comprised of one or more of the bits representing the payload of the given CAN message, and (d) a timestamp field comprised of one or more of the bits representing a timestamp of a time of interception of the given CAN message by the at least one device;

grouping, by the processing resource, the CAN messages of the CAN messages sequence into MID groups, by the CAN MID field;

for each given MID group of the MID groups, splitting, by the processing resource, the CAN messages of the MID group into field groups, wherein each field group comprises a respective field of the fields of the CAN messages of the MID group;

employing, by the processing resource, at least one compression scheme on at east one of the field groups;

generating, by the processing resource, a data structure comprising the field groups, wherein: (a) the field groups that are associated with identical fields are grouped together into field type groups, (b) each of the field type groups is ordered by the CAN MID field associated with the MID group associated with the field groups of the respective field type group, (c) the fields within each of the filed groups are ordered according to an order of interception of the respective CAN messages, and (d) the field type groups are stored at respective known locations within the data structure; wherein the data structure enables reordering the CAN messages according to the given order; and compressing, by the processing resource, the data structure using a lossless compression algorithm, giving rise to a compressed data structure.

12. The method of claim 11, wherein the compression scheme is employed on field groups associated with the payload field, being payload field groups, and wherein the compression scheme further includes, for each payload field group of the payload field groups:

generating a bitmask indicative of (a) constant bits of bits of the payloads within the payload field group, being hits that do not change between the payloads within the payload field group, and (b) non-constant bits of the payloads within the payload field group, being bits that change between the payloads within the payload field group;

omitting from the payloads within the payload field group except a first payload within the payload field group, the bits of the payloads within the payload field group that are indicated as constant bits by the bitmask; and adding the bitmask to the data structure, thereby enabling reconstructing the payloads upon decompressing the compressed data structure.

13. The method of claim 11, wherein the compression scheme is employed on field groups associated with the payload field, being payload field groups, and wherein the compression scheme further includes, for each payload field group of the payload field groups:

generating a bitmask indicative of (a) constant bits of bits of the payloads within the payload field group, being bits that, do not change between the payloads within the payload field group, and (h) non-constant bits of the payloads within the payload field group, being bits that change between the payloads within the payload field group;

omitting from the payloads within the payload field group the bits of the payloads within the payload field groups that are indicated as constant bits by the bitmask; and adding to the data structure (i) the bitmask, and (ii) a value of each of the constant bits, thereby enabling reconstructing the payloads upon decompressing the compressed data structure.

14. The method of claim 11, wherein the compression scheme is employed on the field groups associated with the CAN MID field, being MID field groups, and wherein the compression scheme includes:

counting a number of elements in each MID field group of the MID field groups, giving rise to respective CAN MID counters; and replacing the elements in each MID field group of the MID field groups with a selected element of the elements and the respective CAN MID counter indicative of a number of elements identical to the selected element, thereby enabling reconstructing the MID field group upon decompressing the compressed data structure.

15. The method of claim 11, wherein the compression scheme is employed on the field groups associated with the timestamp field, and wherein the method further comprises truncating, by the processing resource, one or more least significant bits of the timestamps of each timestamp in the field groups associated with the timestamp field.

16. The method of claim 11, further comprising:

generating, by the processing resource, for each CAN message of the CAN messages sequence, an exception indication indicating if a number of bits required to represent a time difference between interception of the respective CAN message and a preceding CAN message preceding the respective CAN message in the CAN messages sequence, if any, is larger than a bit number threshold; and for each CAN message of the CAN messages sequence, having the exception indication indicating that the number of bits required to represent the time difference between interception of the respective CAN message and the preceding CAN message preceding the respective CAN message in the CAN messages sequence is smaller than or equal to the bit number threshold, replacing, by the processing resource, the timestamp of the respective CAN message with bits representing the time difference between interception of the respective CAN message and the preceding CAN message preceding the respective CAN message in the CAN messages sequence, thereby enabling reconstructing the respective timestamp upon decompressing the compressed data structure.

17. The method of claim 11, wherein the compression scheme is further employed on field groups associated with the timestamp field, being timestamp field groups, and wherein the compression scheme further includes, for each given MID group of the Mu) groups:

determining an average interarrival time of the CAN messages within the given MID group;

replacing the timestamp of each CAN message in the given MID group with a difference between the CAN message's timestamp and the CAN message's expected timestamp determined based on the average interarrival time; and adding an indication of the average interarrival time of the CAN messages within the given MID group to the data structure.

18. The method of claim 11, wherein the compression scheme is employed on field groups associated with the payload field, being payload field groups, and wherein the compression scheme further includes:
generating a bitmask indicative of (a) cyclic bits of bits of the payloads within the payload field groups, being bits that have respective repeating patterns over the payloads within the payload field groups, and (b) non-cyclic bits of the payloads within the payload field groups, being bits that do not have a repeating pattern over the payloads within the payload field groups;
omitting from the payloads within the payload field group the bits of the payloads within the payload field groups that are indicated as cyclic bits by the bitmask;
adding the bitmask and the repeating patterns to the data structure, thereby enabling reconstructing the payloads upon decompressing the compressed data structure.

19. The method of claim 11, wherein the compression scheme is employed on field groups associated with the payload field, being payload field groups, and wherein the compression scheme further includes:
updating the payloads within each given payload field group of the payload field groups by performing an XOR operation or a subtract operation, between each payload of the given payload field group and its preceding payload, if any.

20. A non-transitory computer readable storage medium having computer readable program code embodied therewith, the computer readable program code, executable by a processing resource to perform a method for compressing Controller Area Network (CAN) messages, the method comprising:
obtaining, by a processing resource, a CAN messages sequence including a plurality of CAN messages intercepted at a given order by at least one device adapted to monitor messages transmitted via at least one segment, of at least one communication channel of a vehicle, each given CAN message of the CAN messages sequence comprising groups of bits forming at least the following fields: (a) a CAN Message Identifier (MID) field comprised of one or more of the bits representing the CAN MID of the given CAN message, (b) a Data Length Code (DLC) field comprised of one or more of the bits representing a payload length of a payload of the given CAN message, (c) a payload field comprised of one or more of the bits representing the payload of the given CAN message, and (d) a timestamp field comprised of one or more of the bits representing a timestamp of a time of interception of the given CAN message by the at least one device;
grouping, by the processing resource, the CAN messages of the CAN messages sequence into MID groups, by the CAN MID field;
for each given MID group of the MID groups, splitting, by the processing resource, the CAN messages of the MID group into field groups, wherein each field group comprises a respective field of the fields of the CAN messages of the MID group;
employing, by the processing resource, at least one compression scheme on at least one of the field groups;
generating, by the processing resource, a data structure comprising the field groups, wherein: (a) the field groups that are associated with identical fields are grouped together into field type groups, (b) each of the field type groups is ordered by the CAN MID field associated with the MID group associated with the field groups of the respective field type group, (c) the fields within each of the filed groups are ordered according to an order of interception of the respective CAN messages, and (d) the field type groups are stored at respective known locations within the data structure; wherein the data structure enables reordering the CAN messages according to the given order; and
compressing, by the processing resource, the data structure using a lossless compression algorithm, giving rise to a compressed data structure.

* * * * *